219-121 SR

MTR04 XR 3,614,832 see figs. 5-7

Oct. 26, 1971 D. A. CHANCE ET AL 3,614,832

DECAL CONNECTORS AND METHODS OF FORMING DECAL CONNECTIONS TO SOLID STATE DEVICES

Filed March 9, 1966 3 Sheets-Sheet 1

INVENTORS
DUDLEY A. CHANCE
SAMUEL S. IM
JOHN A. PERRI
JACOB RISEMAN

BY Joseph L. Spiegel
ATTORNEY

United States Patent Office 3,614,832
Patented Oct. 26, 1971

3,614,832

DECAL CONNECTORS AND METHODS OF FORMING DECAL CONNECTIONS TO SOLID STATE DEVICES

Dudley A. Chance, Samuel S. Im, John A. Perri, and Jacob Riseman, Poughkeepsie, N.Y., assignors to International Business Machines Corporation, Armonk, N.Y.

Filed Mar. 9, 1966, Ser. No. 533,073
Int. Cl. H05k 3/30
U.S. Cl. 29—626 10 Claims

ABSTRACT OF THE DISCLOSURE

A plurality of connections from electrically conductive lands on an insulating substrate to the contacts of a solid state device are formed in one operation by fixedly positioning the device on, or in a cavity within, the substrate. A decal, including a backing plate with a plurality of conductive strips which can be adhered to the plate by means of a soluble adhesive, is positioned over the device bearing substrate with the strips in registry with respective contacts and lands. The strips are brought into contact with respective contact and land surface portions and subjected to heat and pressure sufficient to cause bonding therebetween. Thereafter, the decal backing plate may be removed from the strips, as by dissolving the adhesive, leaving the strips firmly bonded to the contacts and lands and bridging the space therebetween, whereby the lands are connected to the contacts through the strips.

This invention is directed to connectors and methods of forming connections to solid state devices. In particular, the invention is directed to decal connectors and methods of forming electrical connections to monolithic or integrated semiconductor devices using a decal.

Recent trends in the semiconductor art have been in the direction of packaging semiconductor devices in as small a volume as possible, while still providing adequate connection thereto, and thereby achieve higher operating speeds, lower cost of fabrication, and greater component reliability. Some of these miniature semiconductor devices consist of a number of diodes, transistors, etc., all of which are formed or fabricated in a single substrate of the same semiconductor material. Other fabrication techniques form all the individual semiconductor devices in or on a supporting substrate of any desired insulating material. These fabrication techniques are being extensively developed in order to permit the utilization of the fabricated semiconductor devices into large and complex electronic equipment, such as computers requiring high speed operation. However, regardless of the manner in which the miniaturized semiconductor devices are made, mechanical and electrical connections must be formed between each semiconductor device and its supporting substrate.

Monolithic or integrated circuit devices have prospects of low cost and a high degree of reliability, but there have been technical problems associated with forming connections to the desired circuit portions of such devices from their supporting substrates. Consequently, the failure to make consistently reliable, external interconnections between a semiconductor device and its supporting substrate prevents the formation of electrical systems for utilization in electronic devices such as computers.

Among the factors considered in forming connections to a solid state or semiconductor device are high electrical conductivity and good mechanical strength. Secondly, the connections must be able to withstand stresses developed due to differences in thermal expansion coefficients between the device and its substrate.

Additionally, the connection must efficiently dissipate heat generated by the device, have excellent metallurgical compatibility and high corrosion resistance. Further taking into consideration the small volumetric dimensions involved, the method must readily lend itself to microminiaturization mass production techniques.

One satisfactory connection technique is described in more detail in a copending application entitled "Method for Forming Electrical Connections to a Solid State Device Including Electrical Packaging Arrangements Therefor," by C. Chiou et al., Ser. No. 466,182, filed June 23, 1965 and assigned to the same assignee as the present invention, now U.S. Pat. No. 3,325,182 issued June 20, 1967. In this application, a method of forming electrical connections to a solid state device is described in which a solid state device having electrically conductive contacts is fixedly positioned on, or within a cavity of, a support member or substrate having electrically conductive lands thereon. The lands on the substrate are spaced from the contacts on the solid state device. The space located between the contacts on the solid state device and the lands on the substrate is filled with a removable powdered material. Where the solid state device is made of silicon, the removable powdered material is composed of small $SiO_2$ pellets. Interconnecting electrically conductive strips are formed on the surface of the powdered material by suitable deposition. Preferably, the interconnecting strips are formed by evaporating the conductive metal through a suitable mask in order to permit the interconnecting electrically conductive strips to link up corresponding lands on the substrate and contacts on the solid state device. The powdered material is then removed leaving the solid state device spaced from the substrate, but with the strips bridging the space, and mechanically and electrically connecting lands to contacts.

One of the problems encountered in the technique described in the above mentioned application is that it is difficult to avoid shorting between the edge of the semiconductor or chip device and the evaporated interconnecting strips. Secondly, careful consideration must be given to cavity dimensions in order to facilitate proper powder filling operations. Shadowing during evaporation places a limit on minimum spacing between adjacent strips. In addition, the level of the powder filling materials must be rather precisely controlled so that the evaporation mask is not raised from the lands and contacts, thus giving rise to additional shadowing.

Accordingly, an object of this invention is an improved electrical connection and methods for forming connections to a solid state device.

Another object is a method of forming a connection to a solid state device which is of high electrical conductivity, good mechanical strength, has excellent metallurgical compatibility and high corrosion resistance.

Still another object is a method of forming a plurality of connections to a solid state device in one operation which readily lends itself to microminiaturization mass production techniques.

These and other objects are accomplished in accordance with the present invention, one illustrative embodiment of which comprises fixedly positioning a solid state device having electrically conductive contacts on or in a cavity within a supporting insulating substrate having electrically conductive lands thereon. The lands are spaced from the contacts and have raised surface portions which lie approximately in a common plane. A decal, including a backing plate with a plurality of conductive strips which can be adhered to the plate by means of a soluble adhesive, is positioned over the solid state device bearing substrate with the strips in registry with respective contacts and lands. The strips are brought into contact with respective contact and land surface portions and subjected to heat and pressure sufficient to cause bonding therebetween. Thereafter the decal backing plate is removed from the strips, as by dissolving the adhesive, leaving the strips firmly bonded to the contacts and lands and bridging the space therebetween, whereby the lands are firmly connected mechanically and electrically to the contacts.

Decalcomanias have been proposed before for use in the printed circuit art. Thus, for example, it has been proposed to print a desired circuit on a paper base coated with dextrin which is water soluble permitting subsequent release of the printed pattern from the paper. A thin lacquer is applied to the pattern while it is still on the paper, which film serves to hold the pattern in proper alignment during transfer operation from the base to a substrate. The decal is next soaked in water until the conductive pattern, supported by the lacquer film, floats free. Thereafter, the filmed pattern is transferred to the substrate and bonded thereto while driving off the lacquer. The present invention is distinguishable over such prior art techniques in that, among other reasons, its interconnecting strips are self supporting, that is, possess sufficient mechanical strength to bridge a gap and withstand stresses caused by, for example, difference in thermal expansion of the conductive materials being interconnected. Furthermore, bonding of the interconnecting strips is done while the backing plate is still in place, therefore requiring much less handling of the interconnecting strips.

One feature of the present invention is a method of forming a connection between spaced conductors such as a solid state device contact and an electrically conductive land on a supporting insulating substrate comprising: providing a decal including a backing plate with a conductive strip; bringing the strip into contact with the contact and land; subjecting the strip, contact and land to heat and pressure sufficient to cause bonding therebetween; and, when desired, removing the plate from the strip leaving the strip firmly bonded to the contact and land and bridging the space, whereby the land is firmly connected mechanically and electrically to the contact.

Another feature is the method described above wherein heat is applied through the decal, as by a thermocompression bonder, ultra sonic bonder or laser.

Still another feature is a method of forming a plurality of connections to a solid state device comprising: positioning a solid state device having electrically conductive contacts on a supporting insulating substrate having electrically conductive lands, the lands being spaced from the contacts, the lands and contacts having raised surface portions approximately in a common plane; providing a decal including a backing plate with a plurality of conductive strips; registering the strips with respective contacts and lands; bringing the strips into contact with respective contact and land surface portions; subjecting the strips, contacts and lands to heat and pressure sufficient to cause bonding therebetween; and thereafter removing the plate from the strips leaving the strips firmly bonded to the contacts and lands and bridging the space, whereby the lands are connected mechanically and electrically to the contacts.

A further feature is the method described above including adhering the conductive strips to the backing plate by a soluble adhesive and, after bonding, removing the plate from the strips by dissolving the adhesive.

A still further feature is the method described above including bonding the solid state device to the bottom of a cavity located in the supporting insulating substrate.

Another feature is the method described above wherein a low melting conductive metal such as solder is interposed between strips and conductive lands and contacts.

Still another feature is the method described above wherein heat is applied through the decal.

A further feature is an electrical packaging arrangement comprising a substrate; a solid state device having one or more contacts supported by said substrate; a substrate having one or more conductive lands, the lands being spaced from the contacts and conductive strips bonded between respective lands and contacts.

A still further feature is the above described arrangement wherein the substrate is provided with a cavity, the device is positioned within the cavity, the lands and contacts have raised surface portions approximately in a common plane and the strips are bonded between the respective land and contact surface portions.

The foregoing and other objects, features and advantages of the invention will be apparent from the following more particular description of the preferred embodiments of the invention as illustrated in the accompanying drawings.

Figure 1:
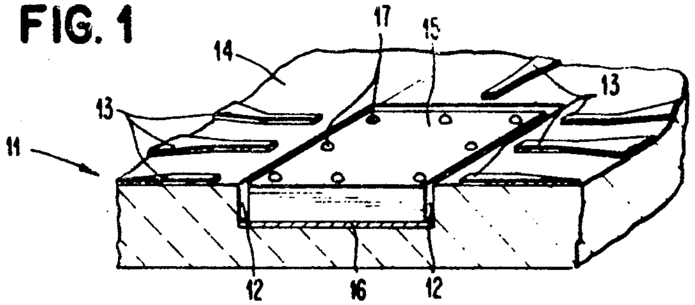
FIG. 1 is an enlarged, fragmentary perspective view of a semiconductor chip device mounted in a cavity portion of a supporting substrate with contacts formed on the chip device and a conductive pattern formed on the substrate.

Referring now to FIG. 1, a supporting substrate generally designated by reference numeral 11 is composed of any of the suitable electrical insulating materials such as glass or, preferably 96% alumina ceramic. The substrate 11 is provided with a plurality of cavities 12 only one of which is shown. The cavities 12 are formed by pressing out the cavity configurations while the ceramic is still in its green state. Alternatively, the cavity 12 can be formed by bonding a pre-cut and pre-drilled alumina sheet onto an alumina blank. In one embodiment the dimensions of the cavity 12 were 60 mils by 60 mils and 10 mils deep. However, the dimensions of the cavity are not critical.

A series of conductive strips or lands 13 are formed on the top surface 14 of the substrate 11, being located about the top edges of the cavity 12 and extending outwardly therefrom to terminal members embedded in the substrate (not shown) which provide electrical and mechanical connection to utilization apparatus (not shown). The lands 13 are formed by well known techniques such as masked evaporation, silk screening or otherwise printing a pattern on the substrate after proper preparation of its surface. The lands 13 are composed of highly conductive materials such as aluminum, copper or one or more of the noble metals and the like. In one embodiment the lands 13 were formed by depositing as by evaporation, through a mask, chromium, copper and a flash of gold. The resulting lands 13 had a thickness of approximately 1 mil, a width of approximately 4 mils, with the distance between the center lines of two adjacent lands 13 being approximately 4 mils.

Disposed within cavity 12 is a chip device 15 such as a monolithic or integrated semiconductor device made of silicon, germanium or the like and having a plurality of active semiconductor devices such as transistors and diodes formed therein. In a typical embodiment the dimensions of the chip device 15 were 56 mils by 56 mils and 8 mils deep.

Chip device 15 is bonded to the substrate by a bonding layer 16 formed at the bottom of cavity 12. The bonding layer 16 is formed by evaporating metallized coatings of chromium and then gold on the bottom of the cavity to a thickness of 1 and 5 microns, respectively, with the substrate 11 being held at an elevated temperature, typically 350° C. The gold metallization is to facilitate the gold-silicon eutectic bonding of the device 15 to the substrate 11. Additionally, a metal coating of 2.5 microns of gold is also deposited on that surface of the device 15 that is to be bonded to the substrate 11, thereby insuring the formation of the gold-silicon eutectic bonding layer. In bonding, a weight of 300 grams is applied to the top surface of the device 15 while the device and substrate are heated to a temperature over 370° C. for a period of time sufficient to form the bond. The bond has good corrosion resistance and high thermal conductance.

Chip device 15 is provided with a plurality of built-up metallic contacts 17 that are formed through suitable openings in a glass protecting layer formed on the chip device 15. Each contact 17 is disposed in line with a respective conductive land 13 formed on the top surface 14 of the substrate 11, and with the top surface of each contact 17 lying, as nearly as possible, in the same plane as the top surface of all other lands 13 and contacts 17. The contacts 17 are formed in the manner in which the lands 17 on the substrate are formed, and of similar material.

Figure 2:
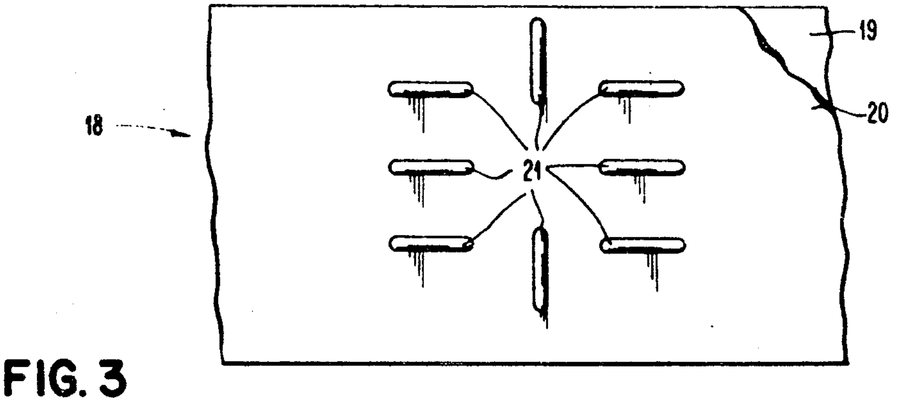
FIG. 2 is a fragmentary, broken out, bottom view of a decal including backing plate, adhesive layer and conductive strips.

FIG. 2 discloses a decal 18 including a temporary backing sheet 19, an adhesive layer 20 and a plurality of conductive strips 21 formed thereon which are to be used for interconnecting the metallic contacts 17 with their respective lands 13. A variety of materials can be used for the backing sheet 19. In general the material should be flexible so as to allow for variation in height levels between lands 13 and contacts 17 and be high temperature resistant so as to withstand bonding temperatures. The material can be electrically conductive or electrically insulating, although electrically insulating materials are to be preferred where the continuity of the electrical circuit is to be tested prior to bonding. The material should also be transparent where the lands on the backing sheet are to be aligned optically with the lands and contacts of the substrate and chip device, respectively. Examples of useful materials are metal foils such as aluminum or copper, paper or other fibrous sheet materials impregnated with reinforcing resins, tetrafluoroethylene fluorocarbon resins, polyethylene terephthylene resins, polyimides and the like. In one embodiment, a mil thick backing sheet made of Kapton polyimide was used.

The backing sheet 19 is coated with an adhesive 20 such as methacrylate or polyacrylate containing solvents which is readily soluble in acetone and forms a parting layer permitting the release of the conductive strips 21 from the backing sheet 19. It is obvious that such an adhesive layer is not necessary. It is only important that one be able to separate the strips 21 from the backing sheet 19 easily and without damaging strips 21.

The strips 21 are formed on the adhesive layer 20 by laminating and etching, masked evaporation or other well known techniques, and are composed of such highly conductive materials as aluminum, copper or one or more of the noble metals and the like. The strips 21 are made thick enough so as to have sufficient strength to be self-supporting once bonded to the underlying conductors and the backing sheet 19 has been removed. In one embodiment, the strips 21 were composed of successive layers of copper, tin, lead and gold applied by masked evaporation techniques to the adhesive layer. The strips 21 had a width of 1.5 mils, a thickness of 0.5 mil and a length of 22 mils.

Figure 3:
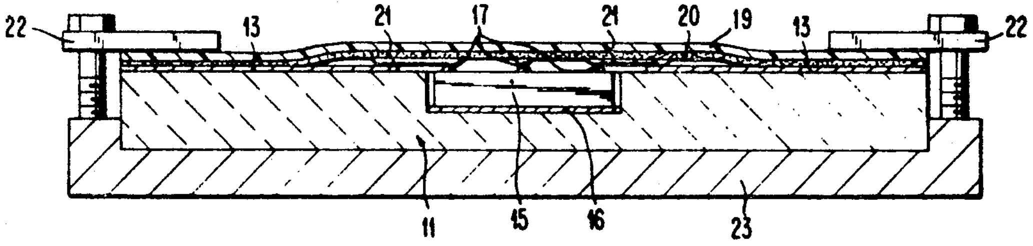
FIG. 3 is a sectional elevation view of the decal clamped in place over the chip device and substrate, the substrate being positioned on a hot stage.

Referring now to FIG. 3, the decal 18 is now positioned over the substrate 11 with the decal strips 21 being located in registry with substrate lands 13 and metallized contacts 17. Only slight pressure need be applied to assure contact between the respective conductive members, as by clamps 22 included in a hot stage 23. If desired the hot stage 23 could be provided with alignment pins to extend through alignment openings in the backing sheet 19 and adhesive layer 20, thus serving to properly orient the strips 21 with respect to the underlying lands 13 and contacts 17.

The strips 21 are then bonded to the lands 13 and contacts 17. A variety of techniques can be used. In the solder-reflow technique illustrated in FIG. 3, either the strips 21 or lands 13 and contacts 17 are precoated with solder such as a 90% lead, 10% tin solder. The substrate 11 is heated on the hot stage 23 until the substrate reaches a temperature at which the solder melts sufficient to bond the strips 21 to their respective lands 13 and contacts 17. The substrate is then cooled leaving the interconnecting strips 21 firmly bonded to their underlying lands 13 and contacts 17. This technique has a virtue that all the chip device contacts 17 are bonded to their respective lands 13 in one operation. The solder reflow technique is described in more detail in a copending application entitled "Terminals for Microminiaturized Devices and Methods of Connecting Same to Circuit Panels," by I. M. Hymes, Ser. No. 333,863, filed Dec. 27, 1963, and assigned to the same assignee as the present invention, now U.S. Pat. No. 3,303,393 issued Feb. 7, 1967.

Figure 4:
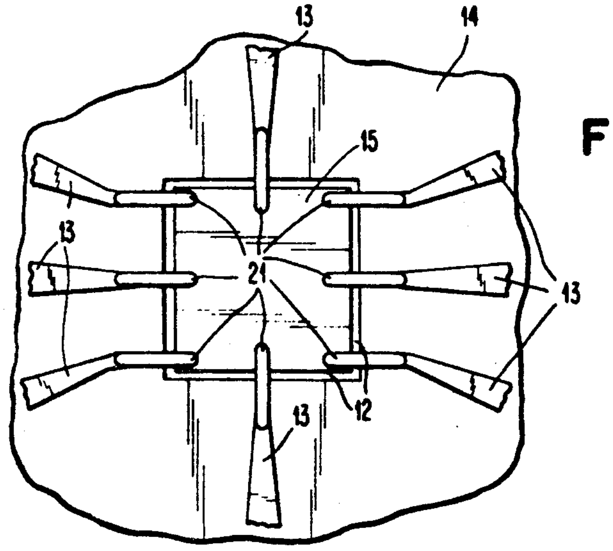
FIG. 4 is a broken out plan view showing the completed interconnection arrangement.

Thereafter the backing sheet is separated from the conductive strips 21. Clamps 22 are removed and the substrate is immersed in a substance such as acetone which will dissolve the adhesive layer 20 permitting the backing sheet 19 to fall off or gently be pulled off the conductive strips 21, leaving the strips 21 in the form of a bridge between lands 13 and contacts 17 (FIG. 4). The solvent has substantially no effect upon the conductive materials, chip device or substrate. Thereafter the substrate 11 is allowed to dry.

Figure 5:
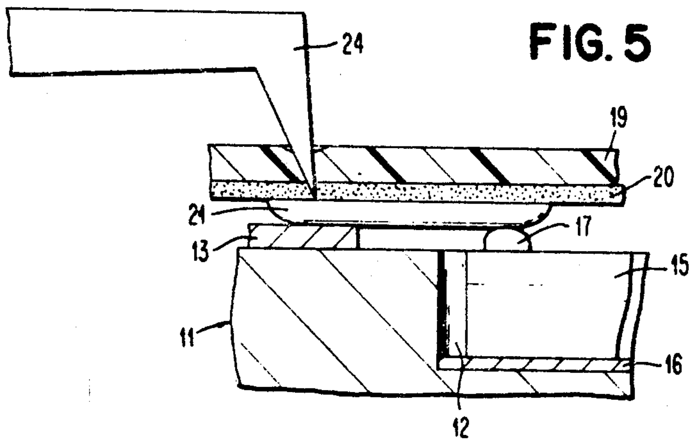
FIGS. 5, 6 and 7 are fragmentary sectional elevation views of a strip being bonded to a chip device contact by means of a thermocompression bonder, ultra sonic bonder and laser, respectively.

In the thermocompression bonding technique illustrated in FIG. 5, after the entire assembly has been raised to an elevated temperature, typically 320° C., the bonding tip 24 of a thermo-compression bonder penetrates the decal backing sheet 19 and adhesive layer 20 and depresses the strip 21 to the contact 17. A thermocompression bond is thus established between one end of the strip 21 and the underlying contact 17. Thereafter the tip is relocated to establish a thermocompression bond between the opposite end of strip 21 and land 13. It will be obvious to those skilled in the art that one can employ a multi-tipped thermocompression bonder to form a plurality of connections in one operation. The thermocompression bonding is described in U.S. Pat. 3,006,067 to O. L. Anderson et al. issued Oct. 31, 1961.

Figures 6, 7:
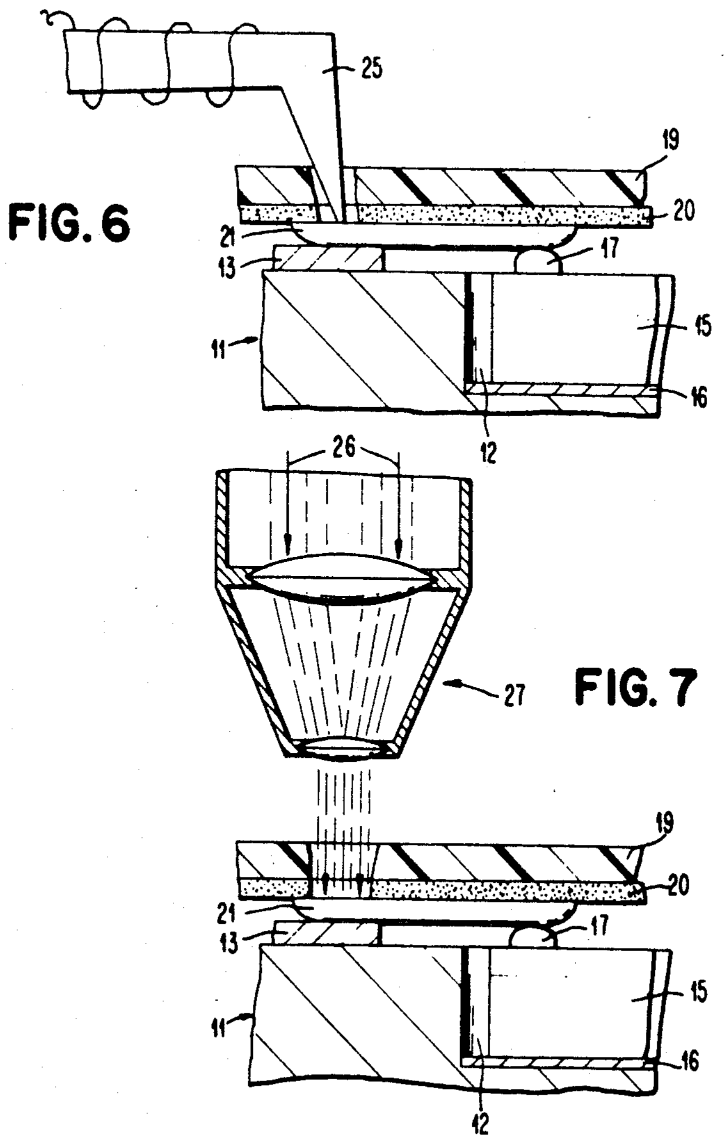

The bonding could also be effected by the ultra sonic technique, as illustrated in FIG. 6. The decal backing sheet 19 and adhesive layer 20 are penetrated with a heated ultra sonic tip 25. As soon as the tip penetrates therethrough, ultra sonic energy is applied to the tip to press the strips 21 to the underlying conductors.

One could also employ the laser or electron beam technique illustrated in FIG. 7 in which an energy beam 26 is focused by means of a lens system 27 onto the strip 21 over the underlying conductor 13 for a length of time necessary for the strip 21 to absorb enough energy to melt and joint to the conductor 13. It will be noted that in the latter three techniques mentioned, heat is applied through the decal.

The invention thus provides an improved method of forming connections to a solid state device which are of high electrical conductivity, good mechanical strength and of excellent metallurgical compatability and high corrosion resistance. Moreover, the method readily lends itself to microminiaturization mass production techniques.

The resistivity of the connections, including the resistivity of the strip 21 and the two bonded joints was found to be approximately 0.3 ohm per strip by the solder reflow technique and 0.2 ohm per strip where heat was applied through the decal. The connections withstand an 80,000 *g*'s centrifuge test for three minutes without breakage as well as a 10-blow shock test of 10,000 *g*'s. Microsectioning of the joints showed excellent metallurgical bonds.

Figure 8:
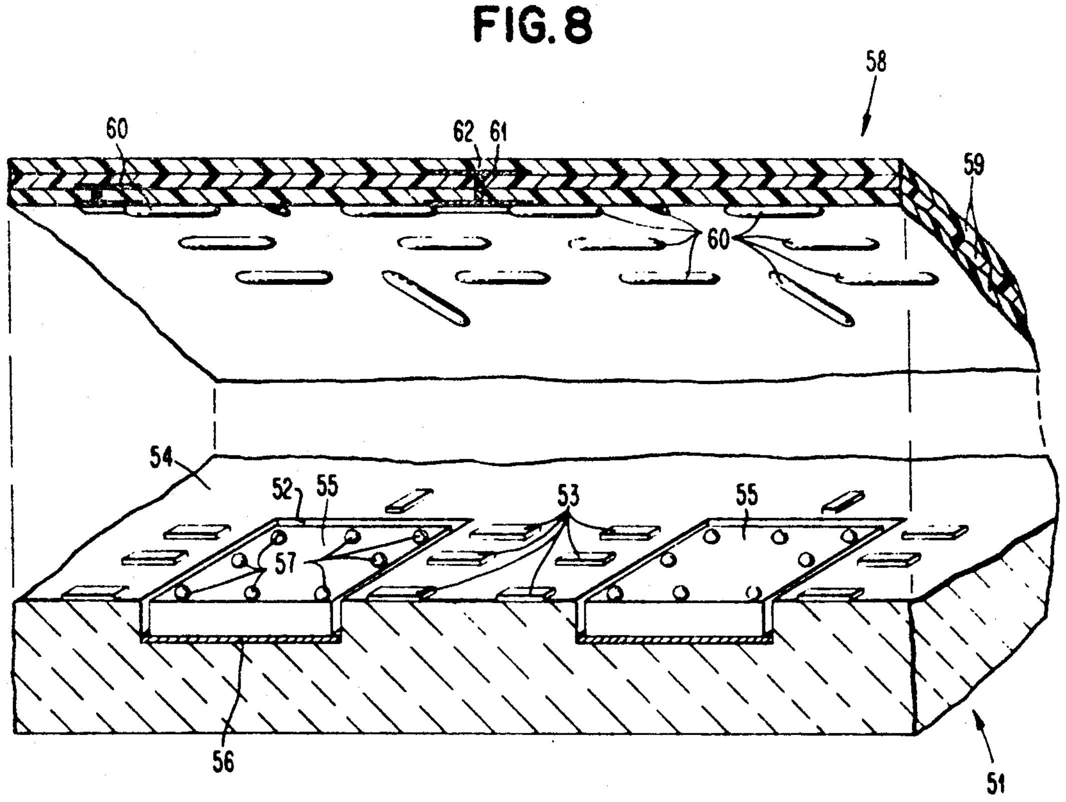
FIG. 8 is an exploded, fragmentary perspective view of another embodiment of the present invention showing chip devices mounted in a supporting substrate and a laminated decal.
Figure 9:
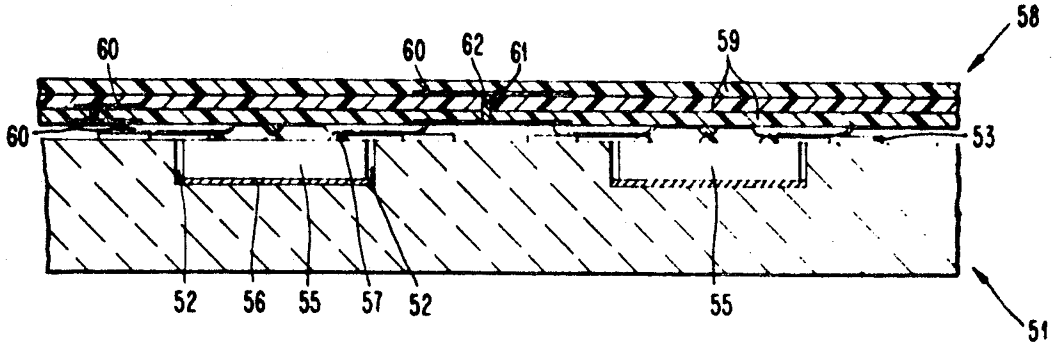
FIG. 9 is a fragmentary sectional elevation view showing the completed interconnection arrangement of the FIG. 8 embodiment.

FIGS. 8 and 9 disclose another embodiment of the present invention which includes circuit personality within a joining decal or carrier which is not to be removed. A supporting substrate 51 is provided with a plurality of cavities 52. A serise of conductive lands 53 are formed on the top surface 54 of the substrate 11, being located about the top edges of the cavities. Chip devices 55 are disposed within each cavity, being secured to the substrate by a bonding layer 56 formed at the bottom of the cavity. Each chip device is provided with a plurality of built up metallic contacts 57, generally disposed in line with a respective conductive land, and with the top surface of each contact lying, as nearly as possible, in the same plane as the top surface of all other lands and contacts.

A decal 58 includes a plurality of insulating sheets 59 such as Kapton polyimide and the like. A plurality of conductive strips 60 are formed on the respective sheets by masked evaporation, electrochemical deposition or other well known techniques. After metallizing, the sheets are bonded together to form the laminate illustrated. At preselected locations through holes 61 are bored through the sheets and metallized in an appropriate manner such as by electrochemical deposition to form electrical connectors 62 between the strips on different layers.

The decal 58 is positioned over the substrate 51 with the strips 60 on the lowermost sheet being located in registry with substrate lands 53 and contacts 57. The strips 60 are then bonded to the lands 53 and contacts 57 as in the previous embodiment. Upon completion of the bonding operation the decal 58 is normally left in place. This embodiment also has the advantage that alignment and bonding can be performed in single operations. In addition, different circuit personalities can be created within the decal 58 so that an array of chips 55 may be similarly joined but perform at the external leads different circuit functions.

While the invention has been particularly shown and described with reference to the preferred embodiments thereof, it will be understood by those skilled in the art that various changes in form and detail may be made therein without departing from the spirit and scope of the invention.

What is claimed is:

1. A method of forming one or more connections to a solid state device comprising:
   (a) positioning a solid state device having one or more electrically conductive contacts on a supporting insulating substrate having one or more electrically conductive lands, said lands being spaced from said contacts, said lands and contacts having raised surfaces portions approximately in a common plane;
   (b) providing a decal including a backing plate with one or more conductive strips;
   (c) registering said strips with respective contacts and lands;
   (d) bringing said strips into contact with respective contact and land surface portions;
   (e) subjecting said strips, contacts and lands to heat and pressure sufficient to cause bonding therebetween, and thereafter;
   (f) removing said plate from said strips, leaving said strips firmly bonded to said contacts and said lands and bridging said space; whereby said lands are firmly connected mechanically and electrically to said contacts.

2. The method according to claim 1 including interposing a layer of a low melting conductive material between said strips and said contacts and lands.

3. A method of forming a plurality of connections to a solid state device comprising:
   (a) positioning a solid state device having electrically conductive contacts on a supporting insulating substrate having electrically conductive lands, said lands being spaced from said contacts, said lands and contacts having raised surface portions approximately in a common plane;
   (b) providing a decal including a backing plate with a plurality of conductive strips adhered to the plate by means of a soluble adhesive;
   (c) registering said strips with respective contacts and lands;
   (d) bringing said strips into contact with respective contact and land surface portions;
   (e) subjecting said strips, contacts and lands to heat and pressure sufficient to cause bonding therebetween, and thereafter;
   (f) removing said plate from said strips by dissolving said adhesive, leaving said strips firmly bonded to said contacts and said lands and bridging said space, whereby said lands are firmly connected mechanically and electrically to said contacts.

4. The method according to claim 3 including interposing a layer of a low melting conductive material between said strips and said contacts and lands.

5. A method of forming a plurality of connections to a solid state device in one operation comprising:
   (a) bonding a solid state device having electrically conductive contacts to the bottom of a cavity located in a supporting insulating substrate having electrically conductive lands thereon, said lands being spaced from said contacts, said lands and contacts having raised surface portions approximately in a common plane;
   (b) providing a decal including a backing plate with a plurality of conductive strips;
   (c) registering said strips with respective contacts and lands;
   (d) bringing said strips into contact with respective contact and land surface portions;
   (e) subjecting said strips, contacts and lands to heat and pressure sufficient to cause bonding therebetween, and thereafter;
   (f) removing said plate from said strips, leaving said strips firmly bonded to said contacts and said lands and bridging said space, whereby said lands are firmly connected mechanically and electrically to said contacts.

6. The method according to claim 5 including interposing a layer of a low melting conductive material between said strips and said contacts and lands.

7. A method of forming a plurality of connections to a solid state device in one operation comprising:
   (a) bonding a solid state device having electrically conductive contacts to the bottom of a cavity located in a supporting insulating substrate having electrically conductive lands thereon, said lands being spaced from said contacts, said lands and contacts having raised surface portions approximately in a common plane;
   (b) providing a decal including a backing plate with a plurality of conductive strips adhered to the plate by means of a soluble adhesive;
   (c) registering said strips with respective contacts and lands,
   (d) bringing said strips into contact with respective contact and land surface portions;
   (e) subjecting said strips, contacts and lands to heat and pressure sufficient to cause bonding therebetween and thereafter;
   (f) removing said plate from said strips by dissolving said adhesive, leaving said strips firmly bonded to said contacts and said lands and bridging said space, whereby said lands are firmly connected mechanically and electrically to said contacts.

8. The method according to claim 7 including interposing a layer of a low melting conductive material between said strips and said contacts and lands.

9. The method according to claim 7 wherein said heat is applied through said decal.

10. The method of interconnecting an array of solid state devices comprising:

providing an insulating substrate with a plurality of cavities and a plurality of electrically conductive lands at the surface of said substrate about said cavities;

providing a plurality of solid state devices each having a plurality of contacts;

bonding said devices to said substrate within said cavities in such manner that said lands and contacts are spaced from one another;

providing a composite carrier having a plurality of conductive strips at its surface and an internal conductor configuration interconnecting said strips where desired;

registering said strips with respective contact and land raised surface portions; and subjecting said strips, contacts and lands to heat said pressure sufficient to cause bonding therebetween, whereby contacts of different solid state devices may be interconnected through said internal conductor configuration.

References Cited

UNITED STATES PATENTS

| | | | |
|---|---|---|---|
| 3,039,177 | 6/1962 | Burdett | 29—625 |
| 3,097,418 | 7/1963 | Valliere | 29—626 X |
| 3,134,930 | 5/1964 | Wright | 317—101 |
| 3,143,787 | 8/1964 | Babbe | 29—625 |
| 3,158,927 | 12/1964 | Saunders | 29—577 |
| 3,184,831 | 5/1965 | Siebertz | 29—155.5 |
| 3,192,307 | 6/1965 | Lazar | 174—68.5 |
| 3,266,125 | 8/1966 | Tobolski | 29—155.5 |
| 3,331,125 | 7/1967 | McCusker | 29—578 |
| 2,984,597 | 5/1961 | Hennes | 156—233 X |
| 3,024,151 | 3/1962 | Robinson | 156—150 |
| 3,240,647 | 3/1966 | Morgan | 156—249 |

DOUGLAS J. DRUMMOND, Primary Examiner

U.S. Cl. X.R.

29—577; 156—73, 230